US010108495B2

(12) United States Patent
Crisan et al.

(10) Patent No.: US 10,108,495 B2
(45) Date of Patent: Oct. 23, 2018

(54) METHOD AND DEVICE FOR IMPROVING THE RELIABILITY OF DATA STORAGE IN A HARD DISK COMPRISING A PLURALITY OF PLATTERS

(71) Applicant: BULL SAS, Les Clayes Sous Bois (FR)

(72) Inventors: Cornel Crisan, La Tronche (FR); Patrice Martinez, Grenoble (FR)

(73) Assignee: BULL SAS, Les Clayes-Sous-Bois (FR)

( * ) Notice: Subject to any disclaimer, the term of this patent is extended or adjusted under 35 U.S.C. 154(b) by 91 days.

(21) Appl. No.: 14/436,144

(22) PCT Filed: Oct. 10, 2013

(86) PCT No.: PCT/FR2013/052417
§ 371 (c)(1),
(2) Date: Apr. 16, 2015

(87) PCT Pub. No.: WO2014/060683
PCT Pub. Date: Apr. 24, 2014

(65) Prior Publication Data
US 2015/0278021 A1     Oct. 1, 2015

(30) Foreign Application Priority Data

Oct. 16, 2012   (FR) ..................................... 12 59858

(51) Int. Cl.
*G06F 11/00*     (2006.01)
*G06F 11/10*     (2006.01)
*G11C 29/52*     (2006.01)

(52) U.S. Cl.
CPC ...... *G06F 11/1096* (2013.01); *G06F 11/1048* (2013.01); *G06F 11/1072* (2013.01);
(Continued)

(58) Field of Classification Search
CPC ............. G06F 11/1096; G06F 11/1072; G06F 11/1048; G06F 11/1076; G06F 2211/1092; G06F 2211/1076; G11C 29/52
(Continued)

(56) References Cited

U.S. PATENT DOCUMENTS 6,546,499 B1 *  4/2003  Challener ........... G06F 11/1076
                                                       714/6.12
2003/0191876 A1 * 10/2003  Fallon .................... G06F 3/0613
                                                       710/68
(Continued)

OTHER PUBLICATIONS

Wikipedia Hard Disk drive page from Oct. 11, 2012, retrieved using the Way Back Machines from: https://web.archive.org/web/20121011192415/https://en.wikipedia.org/wiki/Hard_disk_drive.*
(Continued)

*Primary Examiner* — Yair Leibovich
(74) *Attorney, Agent, or Firm* — Pillsbury Winthrop Shaw Pittman LLP

(57) ABSTRACT

A method for a controller of a hard disk including a plurality of platters, each platter including a data storage surface, the method including: obtaining data blocks, each block having to be or being stored on the hard disk, the number of blocks being less than that of surfaces of platters; calculating a redundancy data block based on each block, the number of redundancy data blocks added to the number of blocks being less than or equal to that of surfaces of platters; writing the redundancy data block on a platter surface, separate from the surfaces for storing each block; accessing data blocks corresponding to a data item to read from the hard disk and accessing a redundancy data block corresponding to the data item to read, each block accessed and each redundancy data block associated with the data item to read being accessed on a separate platter surface; and checking the integrity of the data item.

21 Claims, 3 Drawing Sheets

(52) U.S. Cl.
CPC ......... *G06F 11/1076* (2013.01); *G11C 29/52* (2013.01); *G06F 2211/1076* (2013.01); *G06F 2211/1092* (2013.01)

(58) Field of Classification Search
USPC ....................................................... 714/6.24
See application file for complete search history.

(56) References Cited

U.S. PATENT DOCUMENTS

| | | | |
|---|---|---|---|
| 2005/0025022 A1* | 2/2005 | Nakagawa | G11B 20/18 369/59.23 |
| 2006/0107131 A1 | 5/2006 | Mills et al. | |
| 2008/0235485 A1* | 9/2008 | Haertel | G06F 11/1044 711/203 |
| 2010/0324945 A1* | 12/2010 | Hessing | G06Q 40/06 705/4 |

OTHER PUBLICATIONS

Wikipedia Hard Disk platters page from Sep. 21, 2012, retrieved using the Way Back Machines from: https://web.archive.org/web/20120921200429/http://en.wikipedia.org/wiki/Hard_disk_platters.*
International Search Report as issued in International Patent Application No. PCT/FR2013/052417, dated Dec. 10, 2013.

* cited by examiner

METHOD AND DEVICE FOR IMPROVING THE RELIABILITY OF DATA STORAGE IN A HARD DISK COMPRISING A PLURALITY OF PLATTERS

CROSS REFERENCE TO RELATED APPLICATIONS

This application is the U.S. National Stage of PCT/FR2013/052417, filed Oct. 10, 2013, which in turn claims priority to French Application No. 1259858, filed Oct. 16, 2012. The contents of all of these applications are incorporated herein by reference in their entirety.

The present invention concerns the recording of data in mass memories and more particularly a method and a device for improving the reliability of recording data on a hard disk comprising several platters.

The processing of information in computer systems requires the storage of a potentially high volume of data. For these purposes, there are different types of data storage media each having particular characteristics, and which may be accessed through reading and/or through writing.

Thus, for example, there are memories referred to as random access for which the access is very fast. However, the price of these memories is generally rather high and they are often volatile, that is to say that the data are lost when the memory is no longer electrically supplied.

Alternatively, there are memories for mass storage such as hard disks. Such storage means enable a very high number of data to be stored in non-volatile manner. However, the access to the data stored in such storage means is relatively slow, in particular on account of the mechanical parts employed.

Therefore, computer systems generally use several types of storage media concomitantly.

Furthermore, to take into account possible reading or writing errors in those memories, there are check mechanisms for detecting errors as well as error correcting mechanisms. By way of illustration, such mechanisms may use parity or quorum calculations, or error correcting codes. These different techniques may also be combined.

A parity calculation is directed to calculating a checksum, or fingerprint. The result is sent with the data to send and enables the receiver to check that the data received are indeed the data sent. In certain cases, it also enables an element missing from a data item to be retrieved. A checksum is a redundant data item.

A checksum may, for example, be obtained using the XOR logic function.

By way of illustration, if a data item to send is coded in the following manner, 011010110111, the checksum is equal to 0 (result of the XOR function applied to all the elements of the sent data item). If the received data item, corresponding to the sent data item 011010110111, is 011000110111, the receiver detects a sending error since the checksum of the received data item is equal to 1 (result of the XOR function applied to all the elements of the received data item). In the same way, if the received data item, corresponding to the sent data item 011010110111, is 0110x0110111, where x represents an element not received, that element may be retrieved in order for the checksum of the elements of the received data item to be equal to the checksum for the elements of the sent data item.

There is, in particular, a type of error correcting code, known under the name of Cyclic Redundancy Check code (or CRC), which is commonly used in computing. It is based on the use of the properties of polynomials and consists of considering a data block as the representation of the coefficients of a polynomial which is then divided by a fixed, predetermined polynomial. The coefficients arising from that division constitute the CRC and serve as a correcting code.

Thus, for example, to code a word of m bits, n bits are used, with n>m, where the difference between the values n and m represents the redundancy and determines, according to the algorithm used, the number of bits able to be corrected.

By way of illustration, the correcting code for blocks of 8 bits, known under the name BEC (acronym for Block Error Code), deriving from the theory of Bose-Chaudhuri-Hocquenghem, enables correction of multiple errors distributed randomly. By using two additional bytes per word of 64 bits, stored in blocks of 8 bits, it is possible to correct up to 8 bits in a block.

FIG. 1 diagrammatically illustrates the structure of a hard disk. As represented, it comprises a casing 100 in which is generally arranged a plurality of platters here referenced 105-1 to 105-3. These latter are mounted on a same axis 110 and are driven by a motor (not shown). Typically, each platter comprises an upper face and a lower face on each of which data may be written or read according to a magnetic polarization principle.

The reading and the writing of data on the surface of a platter are carried out using reading and writing heads disposed at the end of a movable arm enabling the heads to be moved along a radial axis of the platter. Each of these heads moves, in general, at a few nanometers from the surface of the platters.

In standard manner, a hard disk comprises a number of arms equal to the number of platters plus one such that an arm is disposed above the upper face of the upper platter (here the arm referenced 115-1), such that an arm is disposed below the lower face of the lower platter (which arm is not visible here) and such that an arm is disposed between each pair of adjacent platters such as arm 115-2 disposed between the lower face of platter 105-1 and the upper face of platter 105-2.

The arms are generally mounted on a same axis (not shown) and are connected to each other. Their movement is controlled by a servo actuator 120.

Moreover, a hard disk comprises a set of electronic circuits 125, called disk controller, for the feedback control of the motors, that is to say the control of the rotation of the platters (generically referenced 105) and of the movement of the arms (generically referenced 115) and the reading and writing of data. The electronic circuits 125 often comprise a buffer memory in which are stored data to write and/or data read to send to a remote device.

The hard disk also comprises an interface 130 to connect it to a remote peripheral, for example an interface in accordance with the IDE standard (IDE standing for Integrated Drive Electronics) the SCSI standard (SCSI standing for Small Computer System Interface), the SATA standard (SATA standing for Serial Advanced Technology Attachment) or the SAS standard (SAS standing for Serial Attached SCSI), as well as a connection 135 for its electrical supply.

FIG. 2 diagrammatically represents the manner in which data are stored on a surface of a platter. As illustrated, a surface of a platter 200 comprises a set of concentric tracks, generically referenced 205, separated by inter-track gaps generically referenced 210. The tracks are divided into sectors 215 where data may be stored.

The data are typically coded continuously within each sector but the sectors used to code a set of data are only rarely contiguous. A data address is, within a hard disk, typically defined by a cylinder reference (representing a track), a head reference (it being noted that a platter is generally associated with a head, it being possible for several heads to be used to read and/or write data on a surface of a platter) and a sector reference.

When a hard disk experiences a failure, for example when a reading head impacts the surface of a platter, data may be definitively lost. To avoid such situations, the manufacturers of hard disks recommend the establishment of a backup system consisting of copying the entirety of the data onto one or more other hard disks or to distribute data over several hard disks. This last solution, known under the name of RAID architecture (RAID standing for Redundant Array of Independent/Inexpensive Disks), consists of storing a data item in several separate devices, with redundancy, such that if one of the devices fails, the parts of the data stored in the other devices enable them to be reconstituted.

However, although there are solutions for enabling data stored in a system having a distributed architecture to be reconstituted, there is no solution to improve the reliability of an autonomous storage system.

The invention enables at least one of the problems set forth above to be solved.

The invention thus relates to a method for a controller of a hard disk comprising a plurality of platters, to improve the reliability of the hard disk, each platter comprising at least one data storage surface, the method comprising the following steps:
  obtaining a plurality of data blocks, each block of said plurality of data blocks having to be or being stored on the hard disk, the number of blocks of said plurality of data blocks being less than the number of surfaces of platters of the hard disk able to store data;
  calculating at least one redundancy data block based on each block of said plurality of data blocks, the number of redundancy data blocks added to the number of blocks of said plurality of data blocks being less than or equal to the number of surfaces of platters of the hard disk able to store data; and
  writing said at least one redundancy data block on a platter surface of the hard disk, separate from the surfaces used to store each block of said plurality of data blocks.

The method according to the invention thus makes it possible improve the reliability of data storage on a hard disk by storing the data and redundant data on separate platters such that if the platter experiences reading problems, the data may nevertheless be recovered.

According to a particular embodiment, said step of obtaining a plurality of data blocks comprises a step of reading, on a platter surface of the hard disk, at least one block of said plurality of data blocks. The method according to the invention thus makes it possible to improve the storage reliability for data that are at least partially stored.

Still according to a particular embodiment, at least one block of said plurality of data blocks is obtained via a communication interface.

Still according to a particular embodiment, the method further comprises a step of decomposing a received data item to store on the hard disk into said plurality of data blocks.

The method according to the invention thus makes it possible to improve the storage reliability for data to store.

Advantageously, the method further comprises a step of writing at least one block of said plurality of data blocks on a platter surface of the hard disk.

Still according to a particular embodiment, the method further comprises the following steps:
  accessing a plurality of data blocks corresponding to a data item to read from the hard disk and accessing at least one redundancy data block corresponding to said data item to read, each block of said plurality of data blocks accessed and each redundancy data block associated with said data item to read being accessed on a separate platter surface of the hard disk; and
  checking the integrity of the data item corresponding to said plurality of data blocks accessed according to said at least one redundancy data block corresponding to said data item to read.

The method according to the invention thus makes it possible to check that the data accessed on a hard disk are valid.

According to a particular embodiment, said checking step comprises a step of calculating at least one redundancy data block.

Still According to a particular embodiment, the method further comprises a step of correcting said data item corresponding to said plurality of data blocks accessed in response to said step of checking according to said at least one redundancy data block corresponding to said data item to read.

The method according to the invention thus makes it possible to recover data stored on a hard disk even if a surface thereof, on which data are stored, cannot be used.

According to a particular embodiment, the method further comprises a step of storing a reading error of a data item on the hard disk and, preferably, a step of estimating a state of reliability of said hard disk. The method according to the invention thus makes it possible to warn a user of a risk of failure capable of leading to the complete loss of data stored on the hard disk.

Still according to a particular embodiment, said calculating of at least one redundancy data block based on each block of said plurality of data blocks obtained uses a parity calculation or an error correcting code.

The invention is also directed to a computer program comprising instructions adapted to the implementation of each of the steps of the method described earlier when said program is executed on a microcontroller as well as to a hard disk controller comprising means adapted to the implementation of each of the steps of the method described earlier. The advantages procured by this computer program and this hard disk controller are similar to those referred to above.

The invention also relates to a hard disk comprising a plurality of platters and a disk controller, the disk controller being configured for
  obtaining a plurality of data blocks, each block of said plurality of data blocks having to be or being stored on the hard disk, the number of blocks of said plurality of data blocks being less than the number of surfaces of platters of the hard disk able to store data;
  calculating at least one redundancy data block based on each block of said plurality of data blocks, the number of redundancy data blocks added to the number of blocks of said plurality of data blocks being less than or equal to the number of surfaces of platters of the hard disk able to store data; and writing said at least one redundancy data block on a platter surface of the hard disk, separate from the surfaces used to store each block of said plurality of data blocks.

The hard disk according to the invention thus makes it possible improve the reliability of data storage on the hard disk by storing the data and redundant data on separate platters such that if the platter experiences reading problems, the data may nevertheless be recovered.

According to a particular embodiment, the disk controller is furthermore configured for, accessing a plurality of data blocks corresponding to a data item to read from the hard disk and accessing at least one redundancy data block corresponding to said data item to read, each block of said plurality of data blocks and each redundancy data block associated with said data item to read being accessed on a separate platter surface of the hard disk; and checking the integrity of the data item corresponding to said plurality of data blocks accessed according to said at least one redundancy data block corresponding to said data item to read.

It is thus possible to check that data accessed on the hard disk are valid.

Other advantages, objects and features of the present invention will emerge from the following detailed description, given by way of non-limiting example, relative to the accompanying drawings in which:

FIG. 1 diagrammatically illustrates the structure of a hard disk;

FIG. 2 diagrammatically represents the manner in which data are stored on a surface of a platter;

In accordance with one embodiment of the invention, each data item of a set of data to store on a hard disk is decomposed to be stored, with redundancy data, on separate platters in order to enable the reconstruction of the data if a platter were to become defective. The reading and/or the writing of data on separate platters may be carried out in parallel or sequentially.

Figure 1:
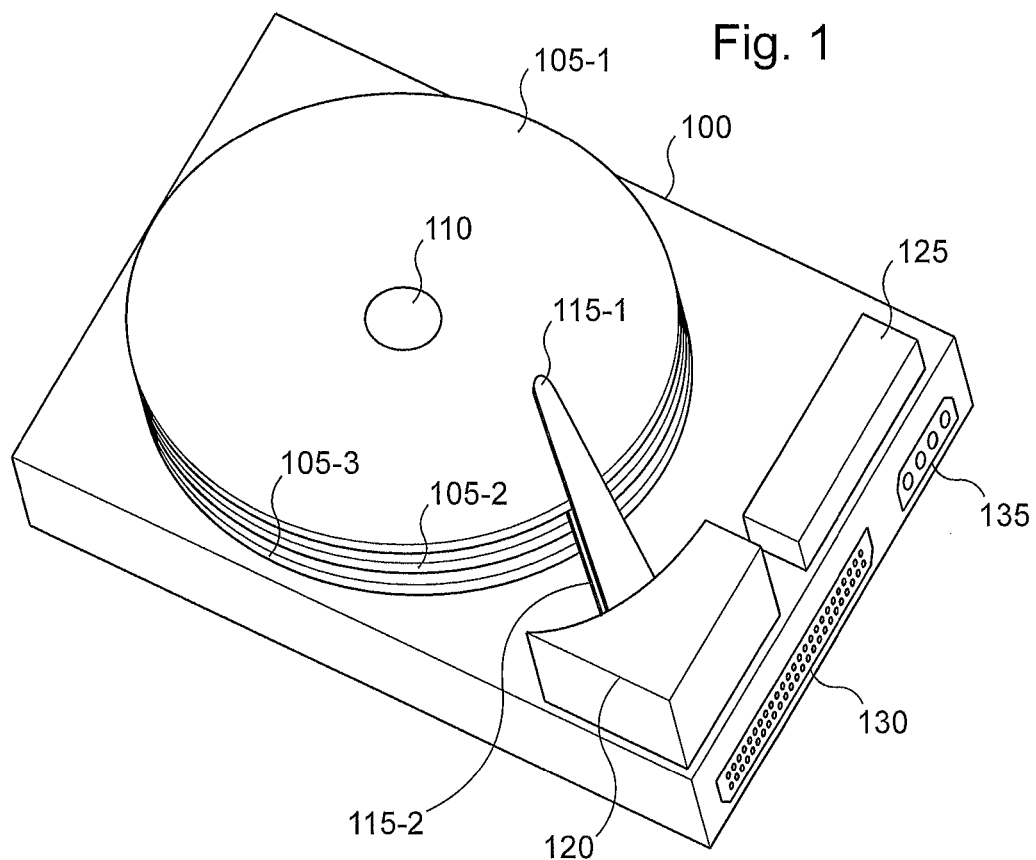
Figure 2:
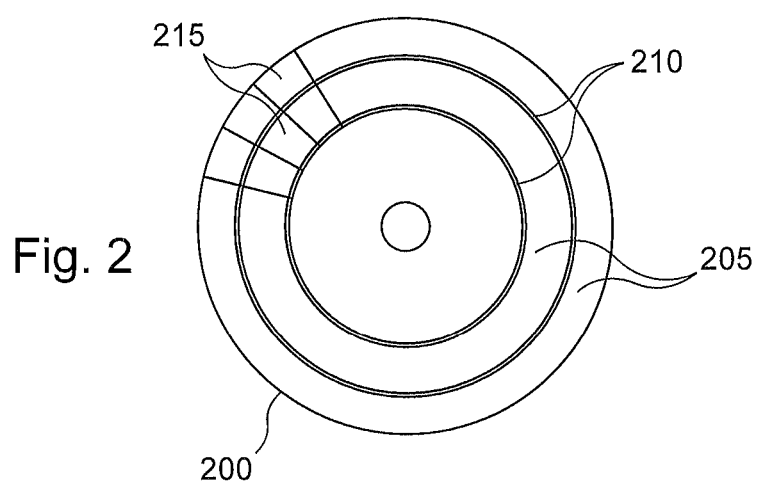
Figure 3:
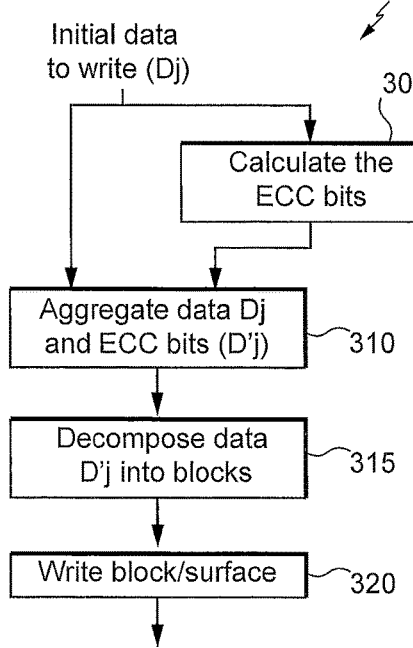
FIG. 3 illustrates an example of an algorithm capable of being used to write data on a hard disk in accordance with a first embodiment of the invention.

FIG. 3 illustrates an example of an algorithm (300) capable of being used to write data on a hard disk in accordance with a first embodiment of the invention;

After having received an initial data item to store on the hard disk ("useful" data), denoted $D_j$, an algorithm for calculating redundancy data, for example an algorithm for calculating an error correcting code of BEC type, is applied to that initial data item (step 305) to produce a redundancy data item, typically ECC bits (ECC standing for Error Correcting Code), for example in the form of one or more data blocks called redundancy data blocks. Such blocks are typically bytes.

The calculated redundancy data item is then aggregated with the initial data item $D_j$ to form a final data item $D'_j$ (step 310) to write which is decomposed into a plurality of data blocks of fixed or variable size (step 315), denoted $B_{i,j}$ where i varies from 1 to n. In other words, the data item to write $D'_j$ is decomposed into n data blocks $B_{i,j}$ It is observed here that as a redundancy data item is generally obtained in the form of blocks, the step of aggregating an initial data item $D_j$ with the corresponding redundancy data item is not always necessary. In this case, only the initial data item $D_j$ is decomposed into m blocks $B_{i,j}$ during step 315, i varying from 1 to m (with m<n, the blocks $B_{i,j}$, j varying from m+1 to n, representing the redundancy data blocks corresponding to the redundancy data blocks calculated at step 305).

Furthermore, it is also noted here that all the data (or a substantial part of the data) are advantageously written on a hard disk according to a same schema, the final data to write (that is to say the aggregation of the initial data to write and redundancy data) being split into blocks according to a same algorithm then written in ordered manner on platter surfaces of the hard disk.

Moreover, to facilitate the management of the addresses and the writing heads and to optimize the movements of the arms supporting them, each block of the same final data item to write on a separate surface is, preferably, written at the same address, that is to say at the same location of the same sector of the same track. Thus, each of those blocks may be written in parallel.

The final data item is next written in the form of blocks on several platters of the hard disk. For these purposes, the initial data blocks as well as the corresponding redundancy data block or blocks, that is to say the set of the blocks $B_{i,j}$, are written on separate surfaces of the platters of the hard disk (step 320). In other words, each block $B_{i,j}$ is written here, whether or not continuously, on a separate surface $S_i$, i varying from 1 to n.

By way of illustration, it is considered here that the initial data item to write is coded over 64 bits and that the error correcting code is coded over 2 bytes. To be stored, the initial data item is split into 8 blocks of one byte. Each of the 10 bytes of the final data item to write (8 bytes of initial data and 2 bytes of error correcting code) is then written on a separate surface of the hard disk which thus requires at least five platters if data may be stored on each of the two surfaces of each platter.

According to this example and a particular embodiment, the first byte of each data item stored on the hard disk is written on a first surface of a first platter, the second byte of each data item stored on the hard disk is written on a second surface of the first platter, the third byte of each data item stored on the hard disk is written on a first surface of a second platter and so forth until the eighth byte which is written on a second surface of a fourth platter. In similar manner, the first byte of each error correcting code of each data item stored on the hard disk is written on a first surface of a fifth platter and the second byte of each error correcting code of each data item stored on the hard disk is written on a second surface of the fifth platter.

Thus, if a surface of a platter becomes illegible for a particular reason, for example further to a scratch caused by rubbing of a reading or writing head on the surface, it is possible to recover the data using the redundant data, on account of the structure of coding by surface.

Figure 4:
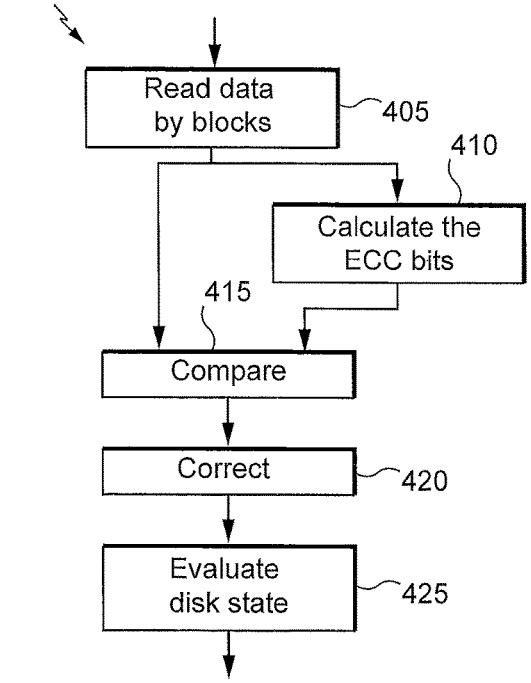
FIG. 4 illustrates an example of an algorithm capable of being used to read data on a hard disk, those data having been stored in advance on the hard disk in accordance with an embodiment of the invention, for example the embodiment described with reference to FIG. 3.

FIG. 4 illustrates an example of an algorithm (400) capable of being used to read data on a hard disk, those data having been stored in advance on the hard disk in accordance with an embodiment of the invention, for example the embodiment described with reference to FIG. 3.

The reading of a data item (step 405) is carried out here by blocks, each block being read on a separate surface of the platters of the hard disk, in accordance with a predetermined writing schema for the data item.

Again, to facilitate the management of the addresses and the reading heads and to optimize the movements of the arms supporting them, each block of the same final data item written on a separate surface is written at the same address, that is to say at the same location of the same sector of the same track. Thus, each of those blocks may be read in parallel.

An algorithm for calculating redundancy data, for example an algorithm for calculating an error correcting code of BEC type, is then applied to the blocks read and corresponding to the initial data (step 410) to produce a redundancy data item, typically ECC bits (ECC standing for Error Correcting Code), for example in the form of one or more redundancy data blocks. The algorithm for calculating redundancy data used here is the same as that which served to calculate the redundancy data blocks read.

The redundancy data blocks read are next compared with the calculated redundancy data blocks (step 415) to detect any reading error. Such a comparison is for example carried out in a module called syndrome generator.

If a reading error is detected and if it is possible to correct it using the redundancy data and the result of the comparison, the read data is corrected (step 420).

Furthermore, if a reading error is detected, a trace thereof is, preferably, stored on the hard disk and an estimation of the state of reliability of the latter is made (step 425). Such a step is directed here to warning a user of the hard disk of a degraded state of the latter in order to advise him to make a copy of its content while the data (or a part thereof) may be recovered.

The state of the hard disk may be estimated, for example, by comparing the number of errors detected during a given period of time with a predetermined threshold or by comparing the spread, over time, of errors detected with a predetermined threshold. Such an estimation may be made for the whole of the hard disk or for a given surface of a platter of the hard disk, for example the surface for which the most errors have been detected during a given period of time.

When the state of the hard disk attains a critical threshold, an alarm message is, preferably, sent to the user to enable him to make a backup of the content of the hard disk.

The saving of the content of the hard disk then consists, typically, in reading all the data of the hard disk according to an algorithm such as that described with reference to FIG. 4 and in writing them on another hard disk using, for example, an algorithm such as that described with reference to FIG. 3.

According to a particular embodiment, the algorithms described with reference to FIGS. 3 and/or 4 are implemented in the form of computer programs, in particular in the form of firmware.

According to another embodiment, a surface of a platter is used to store the results of parity calculations, that is to say checksums, of initial data ("useful" data) stored on at least two other platter surfaces.

The parity calculation may be carried out on several elements of a same data item (for example if a data item is coded over two bytes and each of those two bytes is stored on a separate platter surface) or on several elements having no link between them (for example if a first set of data is stored on a first platter surface and if a second set of data is stored on a second platter surface, separate from the first).

According to a particular embodiment, an initial data item to write on the hard disk is decomposed into several elements, preferably of the same length, each element having to be stored on a separate surface of a platter. A checksum is calculated for the set of those elements. It is, preferably, obtained by application of the XOR logic function to the set of the elements of the initial data item. These elements of the initial data item and the checksum (that is to say the result of the parity calculation) are each stored on a separate platter surface.

Thus, by way of illustration, when an initial data item is decomposed into n elements $E_i$ (i varying from 1 to n), for example n bytes, the checksum Sc may be obtained by application of the XOR function (denoted $\oplus$) to each element $E_i$ in the following manner:

$$Sc = E_1 \oplus E_2 \oplus \ldots \oplus E_n$$

When an element comprises several unitary elements (for example several bits), the parity calculation may be carried out unitary element by unitary element (for example bit by bit).

According to another particular embodiment, initial data, whether linked together or not, are stored by packets on the hard disk. Each packet here comprises a predetermined number of initial data items and each initial data item of a packet is stored here on a separate surface of a platter. A checksum is then calculated for the set of initial data of each packet. Again, this checksum may be obtained by application of the XOR logic function.

By way of illustration, when a set of n initial data $D_i$ (i varying from 1 to n) is to be stored on the hard disk, the checksum Sc may be obtained by application of the XOR function to each initial data item $D_i$ in the following manner, unitary element by unitary element (for example bit by bit):

$$Sc = D_1 \oplus D_2 \oplus \ldots \oplus D_n$$

The initial data and the checksum are then each stored on a separate platter surface.

Still according to another particular embodiment, an initial data item is stored on a platter surface of a hard disk. Before or after the initial data item is stored, data stored on other platter surfaces of the hard disk, for example on each other platter surface of the hard disk, with the exception of the platter surface used to store checksums, is obtained (typically read) to enable the calculation of a corresponding checksum. By way of illustration, these data may be determined according to the physical address (typically defined by the cylinder, a head and a sector), for each platter surface of the disk, with the exception of those used to store the initial data item to be stored and checksums, at which is or is to be added the initial data item to be stored. A checksum of the initial data to be stored and of the data obtained is then calculated. Again, this checksum may be obtained by application of the XOR logic function.

By way of illustration, when an initial data item D is to be stored at a particular address of a platter surface, the data stored at the same address on the other platter surfaces, with the exception of the platter surface used to store the checksums, called $D'_i$ (i varying from 2 to n) are obtained and the checksum Sc is calculated, for example by application of the XOR function in the following manner:

$$Sc = D_1 \oplus D'_2 \oplus \ldots \oplus D'_n$$

In similar manner, it is possible to calculate a checksum concerning several initial data to store and several read data, these data being stored or read on separate platter surfaces.

Still according to another particular embodiment, the data on the basis of which checksums must be calculated and stored are already stored on the hard disk. These stored data are thus read to enable the calculation of checksums which are then stored on a separate platter surface.

Figure 5:
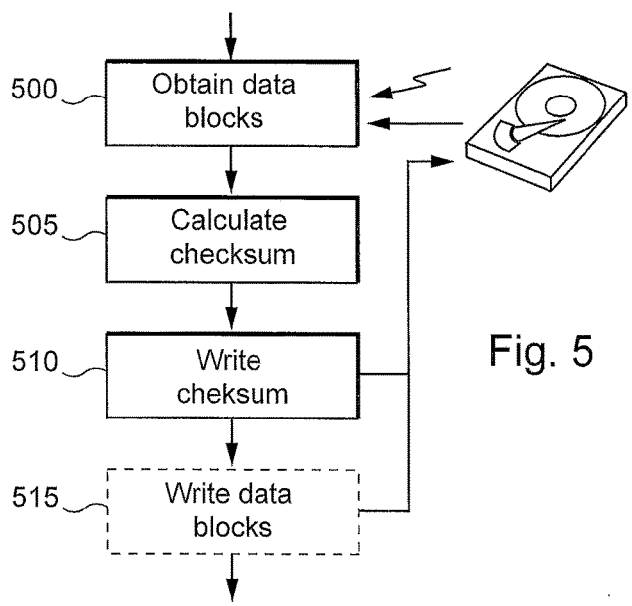
FIG. 5 illustrates an example of an algorithm capable of being used to write data on a hard disk in accordance other embodiments.

An example of steps of these embodiments is illustrated in FIG. 5.

A first step (step 500) is directed to obtaining the data blocks to be used to calculate a checksum. As illustrated diagrammatically, these blocks may come from a communication interface or the hard disk. Thus, according to the embodiment implemented, all the data blocks come from the communication interface (typically when those data blocks are to be stored on the hard disk), all the blocks come from the hard disk (when the blocks have already been stored and a function for providing security for the data is called) or one or more data blocks come from the communication interface and one or more data blocks come from the hard disk (typically when an item of data to be stored is stored on a single platter surface).

A checksum is calculated in a following step (step 505) on the basis of the data blocks obtained previously. As described above, the checksum may in particular be calculated using the XOR logic function, for example by applying that function to each bit of all the blocks.

If each data block comprises m bits denoted $B_{i,j}$ where i represents a data block index and j represents an index on the bits within the data block $B_i$, if the checksum is calculated on n data blocks, the bit j of the checksum Sc may be expressed in the following manner:

$$Sc_j = B_{1,j} \oplus B_{2,j} \oplus \ldots \oplus B_{n,j}$$

The checksum obtained is then stored on the hard disk, on a predetermined platter surface (step 510).

The data blocks on the basis of which was obtained the checksum and which come from the communication interface are next, the case arising, preferably, stored on the hard disk (step 515). Each block is stored on a separate platter surface, different from the platter surfaces from which come, the case arising, the data blocks used to calculate the checksum.

According to still another embodiment, several platter surfaces are used to store redundancy data. Thus, by using n platter surfaces to store redundancy data, obtained from separate mechanisms, it is possible to recover data when the data stored on several platter surfaces are illegible: up to n surfaces may typically have reading problems.

Such an embodiment implements a similar principle to that used in the systems known under the name RAID-6.

Thus, for example, the invention may be implemented on a hard disk comprising four platter surfaces to store initial data ("useful" data) and two platter surfaces to store redundancy data (disk 4+2) or on a hard disk comprising eight platter surfaces to store initial data and two platter surfaces to store redundancy data (disk 8+2). Such hard disks enable a quorum mechanism to be implemented enabling errors to be detected and corrected.

Again, for these different embodiments, if a reading error is detected, a trace thereof is, preferably, stored on the hard disk and an estimation of the reliability state of the latter is made in order to warn a user of the hard disk of a degraded state thereof and advise him to make a copy of its content while the data (or a part thereof) may be recovered.

The state of the hard disk may in particular be estimated by comparing the number of errors detected during a given period of time with a predetermined threshold or by comparing the spread, over time, of errors detected with a predetermined threshold. Such an estimation may be made for the whole of the hard disk or for a given surface of a platter of the hard disk, for example the surface for which the most errors have been detected during a given period of time.

When the state of the hard disk attains a critical threshold, an alarm message is, preferably, sent to the user to enable him to make a backup of the content of the hard disk.

Figure 6:
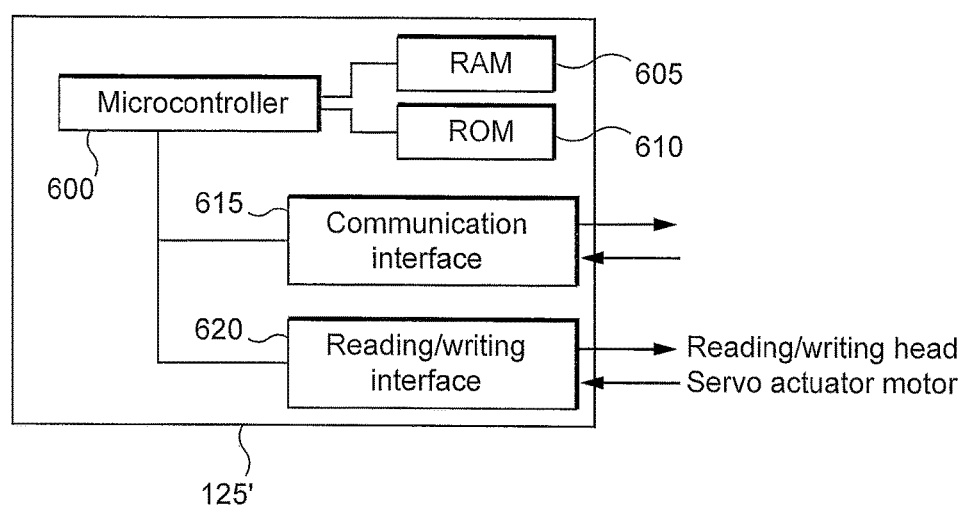
FIG. 6 diagrammatically illustrates an example of architecture for a disk controller of a hard disk adapted to implement an embodiment of the invention, in particular the algorithms described with reference to FIGS. 3, 4 and 5.

FIG. 6 diagrammatically illustrates an example of architecture for a disk controller of a hard disk adapted to implement an embodiment of the invention, in particular the algorithms described with reference to FIGS. 3, 4 and 5.

As illustrated, the disk controller 125' here comprises a microcontroller 600 (or CPU, standing for Central Processing Unit). The latter is connected here to
  a first memory 605, for example a RAM type memory (RAM being an acronym for Random Access Memory), comprising registers adapted to record variables and parameters created and modified during the execution of programs, in particular data to write on the hard disk or data read from the hard disk;
  a second memory 610, for example a memory of EEPROM type (EEPROM standing for Electrically-Erasable Programmable Read Only Memory), adapted for example to store programs implementing the algorithms described with reference to FIGS. 3, 4 and 5 as well as data relative to reading errors;
  a communication interface 615; and
  a read/write interface 620.

The communication interface 615 is typically connected to a computer, for example via an SCSI bus. The read/write interface 620 is connected to the motor driving the platters, to the servo actuator of the arms comprising the reading and writing heads as well as to these latter.

The microcontroller 600 controls and directs the execution of the instructions of portions of software code of the program or programs.

Naturally, to satisfy specific needs, a person competent in the field of the invention will be able to apply modifications to the preceding description. The present invention is not limited to the described embodiments, other variants and combinations of features are possible.

The present invention has been described and illustrated in the present detailed description with reference to the appended Figures. However, the present invention is not limited to the embodiments presented. Other variants and embodiments may be deduced and implemented by the person competent in the field of the invention on reading the present description and appended Figures.

In the claims, the term "comprise" does not exclude other elements or other steps. The indefinite article "a" does not exclude the plural. A single processor or several other units may be used to implement the invention. The different features presented and/or claimed may advantageously be combined. Their presence in the description or in different dependent claims, does not indeed exclude the possibility of combining them. The reference signs are not to be understood as limiting the scope of the invention.

The invention claimed is:
1. A method for a controller of a hard disk comprising a plurality of platters, to improve the reliability of the hard disk, each platter comprising at least one data storage surface, the method comprising:
  obtaining a plurality of data blocks, each block of said plurality of data blocks having to be or being stored on the hard disk, a number of blocks of said plurality of data blocks being less than a number of surfaces of platters of the hard disk able to store data;

calculating at least one redundancy data block based on each block of said plurality of data blocks, a number of redundancy data blocks added to the number of blocks of said plurality of data blocks being less than or equal to the number of surfaces of platters of the hard disk able to store data;

writing said at least one redundancy data block on a platter surface of the hard disk, separate from the surfaces used to store each block of said plurality of data blocks;

accessing a plurality of data blocks corresponding to a data item to read from the hard disk and accessing at least one redundancy data block corresponding to said data item to read, each block of said plurality of data blocks accessed and each redundancy data block associated with said data item to read being accessed on a separate platter surface of the hard disk; and after accessing both the plurality of data blocks corresponding to the data item to read from the hard disk and the at least one redundancy data block corresponding to said data item to read, checking an integrity of the data item corresponding to said plurality of data blocks accessed according to said at least one redundancy data block corresponding to said data item to read, wherein each of the plurality of data blocks corresponding to the data item and each redundancy data block associated with said data item are written on separate platter surfaces at a same location of a same sector of a same track of the hard disk.

2. The method according to claim 1, wherein said obtaining a plurality of data blocks comprises reading, on a platter surface of the hard disk, at least one block of said plurality of data blocks.

3. The method according to claim 1, wherein at least one block of said plurality of data blocks is obtained via a communication interface.

4. The method according to claim 3, further comprising writing at least one block of said plurality of data blocks on a platter surface of the hard disk.

5. The method according to claim 1, further comprising decomposing a received data item to store on the hard disk into said plurality of data blocks.

6. The method according to claim 1, wherein said checking comprises calculating at least one redundancy data block.

7. The method according to claim 1, further comprising correcting said data item corresponding to said plurality of data blocks accessed in response to said checking according to said at least one redundancy data block corresponding to said data item to read.

8. The method according to claim 1, further comprising storing a reading error of a data item on the hard disk.

9. The method according to claim 1, further comprising estimating a state of reliability of said hard disk.

10. The method according to claim 1, wherein said calculating of at least one redundancy data block based on each block of said plurality of data blocks obtained uses a parity calculation or an error correcting code.

11. A non-transitory computer readable medium comprising instructions adapted for carrying out the method according to claim 1 when said instructions are executed on a microcontroller.

12. A hard disk controller comprising components adapted for the implementation of the method according to claim 1.

13. A hard disk comprising a plurality of platters and a disk controller, wherein the disk controller is configured to obtain a plurality of data blocks, each block of said plurality of data blocks having to be or being stored on the hard disk, a number of blocks of said plurality of data blocks being less than a number of surfaces of platters of the hard disk able to store data;

calculate at least one redundancy data block based on each block of said plurality of data blocks, a number of redundancy data blocks added to the number of blocks of said plurality of data blocks being less than or equal to the number of surfaces of platters of the hard disk able to store data;

write said at least one redundancy data block on a platter surface of the hard disk separate from the surfaces used to store each block of said plurality of data blocks;

access a plurality of data blocks corresponding to a data item to read from the hard disk and accessing at least one redundancy data block corresponding to said data item to read, each block of said plurality of data blocks and each redundancy data block associated with said data item to read being accessed on a separate platter surface of the hard disk; and after accessing both the plurality of data blocks corresponding to the data item to read from the hard disk and the at least one redundancy data block corresponding to said data item to read, check an integrity of the data item corresponding to said plurality of data blocks accessed according to said at least one redundancy data block corresponding to said data item to read, wherein each of the plurality of data blocks corresponding to the data item and each redundancy data block associated with said data item are written on separate platter surfaces at a same location of a same sector of a same track of the hard disk.

14. The hard disk according to claim 13, wherein to obtain a plurality of data blocks, the disk controller is configured to read, on a platter surface of the hard disk, at least one block of said plurality of data blocks.

15. The hard disk according to claim 13, wherein at least one block of said plurality of data blocks is obtained via a communication interface.

16. The hard disk according to claim 13, wherein the disk controller is configured to decompose a received data item to store on the hard disk into said plurality of data blocks.

17. The hard disk according to claim 16, wherein the disk controller is further configured to write at least one block of said plurality of data blocks on a platter surface of the hard disk.

18. The hard disk according to claim 13, wherein to perform said checking, the disk controller is configured to calculate at least one redundancy data block.

19. The hard disk according to claim 13, wherein the disk controller is configured to correct said data item corresponding to said plurality of data blocks accessed in response to said checking according to said at least one redundancy data block corresponding to said data item to read.

20. The hard disk according to claim 13, wherein the disk controller is further configured to store a reading error of a data item on the hard disk.

21. A method for a controller of a hard disk comprising a plurality of platters, to improve the reliability of the hard disk, each platter comprising at least one data storage surface, the method comprising:

accessing a plurality of data blocks that are stored on the hard disk, wherein the plurality of data blocks correspond to a data item to be read from the hard disk;

accessing at least one redundancy data block corresponding to the data item, the at least one redundancy data block being previously calculated based on each of the plurality of data blocks; and after accessing the plurality of data blocks and the at least one redundancy data block from the hard disk, checking an integrity of the data item corresponding to the plurality of data blocks according to the at least one redundancy data block, wherein a number of the plurality of data blocks added to a number of the redundancy data blocks is less than or equal to a number of surfaces of platters of the hard disk able to store data, and wherein each of the plurality of data blocks and each of the at least one redundancy data block are accessed from a separate platter surface of the hard disk at a same location of a same sector of a same track of the hard disk.

* * * * *